United States Patent [19]

Arnoldi et al.

[11] 4,041,388
[45] Aug. 9, 1977

[54] TRANSISTOR CIRCUIT

[75] Inventors: Hugh Arnoldi, Londondary, N.H.; Leonard Robert Salvatore, Greenbrook, N.J.

[73] Assignee: RCA Corporation, New York, N.Y.

[21] Appl. No.: 547,020

[22] Filed: Feb. 4, 1975
(Under 37 CFR 1.47)

[51] Int. Cl.² ............... G01R 31/22; H03K 5/153
[52] U.S. Cl. ............................. 324/158 T; 307/354
[58] Field of Search ............ 324/158 T, 158 R, 73 R; 307/235 E, 252 UA

[56] References Cited
U.S. PATENT DOCUMENTS 3,350,641 10/1967 Lubkin et al. ................. 324/158 T
3,697,782 10/1972 Matouka ......................... 307/235 E Primary Examiner—Rudolph V. Rolinec
Assistant Examiner—Ernest F. Karlsen
Attorney, Agent, or Firm—H. Christoffersen; A. L. Limberg; J. M. O'Meara

[57] ABSTRACT

The base-emitter junction of a bipolar transistor is first forward biased to place the transistor in a state of conduction and the forward bias is then removed. A discharge path is provided for the base-emitter capacitance of the transistor, this path including a source of reverse bias voltage for the base-emitter junction. A sensing circuit indicates when the base-emitter capacitance has discharged through the path sufficiently to permit the base-emitter junction to become reverse biased, which in turn indicates that the transistor has cutoff.

8 Claims, 1 Drawing Figure

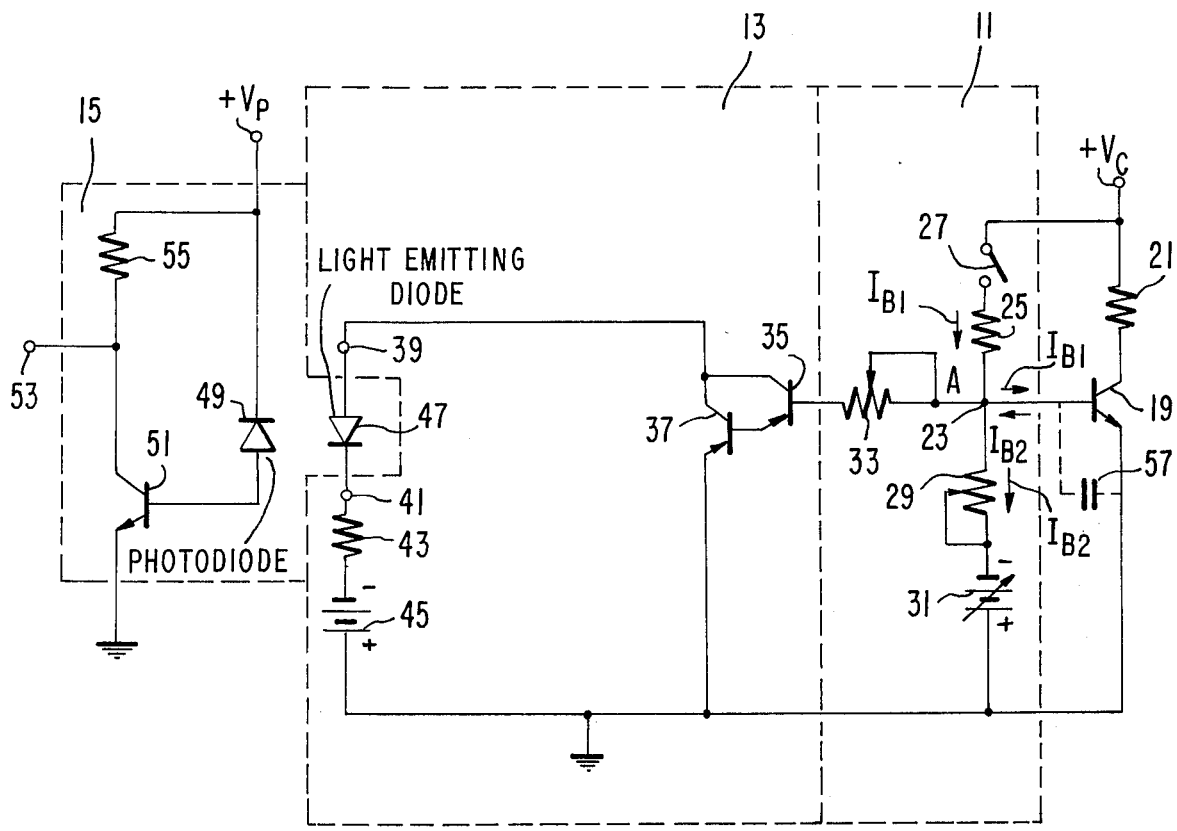

TRANSISTOR CIRCUIT

There are a number of applications, such as in circuits for testing the performance of transistors, where one wishes to indicate the instant in time when the transistor turns off. Such an indication may be obtained by monitoring the voltage at (or current flowing to the) collector electrode of the transistor. However, this is sometimes an undesirable approach. For example, in testing a transistor for reverse-bias secondary breakdown, an inductor may be placed in series between the collector of the transistor being tested and a voltage or current source. At substantially the instant in time that the transistor goes into cutoff, the voltage or current source is removed from the circuit, to permit the inductive voltage kickback from the inductor to place the transistor into secondary breakdown. A known amount of charge is placed on the inductor just prior to such secondary breakdown. If circuits are present for monitoring the collector voltage (or current) of the transistor, they tend to complicate the accurate charging of the inductor. Also, such circuits sometimes themselves can introduce currents which can cause catastrophic failure of the transistor under test.

The circuits of the present invention, rather than monitoring the collector voltage or current, sense the voltage across the base-emitter junction. The junction capacitance first is charged in the forward direction and then is discharged to a reverse bias condition. The point at which the charge on the capacitance reaches a given value, such as one indicating that the junction has just started to become reverse biased, is sensed and employed to cause an output pulse to be produced.

In the drawing:

The sole FIGURE of the drawing is a schematic diagram of a storage time tracker circuit embodying the invention.

The circuit shown, which may be termed a "storage time tracker", includes a base bias network 11; a solid-state switch 13; and an optical isolator 15. The transistor 19 under test is connected at its emitter electrode to a point of reference potential, such as ground, and at its collector electrode via resistor 21 to a positive voltage source $V_c$. The base electrode of this transistor is connected to terminal 23 of the bias network 11.

The bias network 11 includes a resistor 25 having one end connected to the terminal 23, and its other end connected to one terminal of a switch 27. The other terminal of the switch 27 is connected to the positive voltage supply $V_c$. The switch, while illustrated as a mechanical switch, may instead be an electronic switch. The latter may be especially advantageous in test equipment designed to measure the time interval between a control pulse employed to open the switch 27 and the output pulse at terminal 53, this interval being proportional to the turn-off time of the transistor 19 under test. An adjustable resistor 29 is connected at one end to the input terminal 23, and at its other end to the negative terminal of variable voltage supply 31. The positive terminal of this voltage supply 31 is connected to ground. Another adjustable resistor 33 is connected between the terminal 23 and the solid-state switch 13.

The solid-state switch 13 includes a pair of PNP transistors 35 and 37 interconnected into a Darlington configuration. The base electrode of transistor 35 is connected to one end of resistor 33 of bias network 11, the emitter electrode of transistor 37 is connected to ground, and the commonly connected collector electrodes of the transistors 35, 37 are connected to a first output terminal 39. A second output terminal 41 is connected to one end of a resistor 43. The voltage source 45 is connected at its negative terminal to the other end of resistor 43, and at its positive terminal to ground.

An optical isolator, such as a Hewlett-Packard Co. Model HP4351-406, has a light emitting diode 47 connected with its anode and cathode electrodes to output terminals 39 and 41 of solid-state switch 13, respectively. A photo diode 49, responsive to light emitted by light emitting diode 47, is connected with its cathode electrode to a positive voltage source $V_p$, and its anode electrode to the base electrode of NPN switching transistor 51. The collector electrode of the NPN switching transistor 51 is connected to an output terminal 53 and to one end of resistor 55, the other end of the resistor 55 being connected to the positive voltage source $V_p$. The emitter electrode of transistor 51 is connected to ground.

In operation, the switch 27 is closed either manually or automatically to apply a forward bias voltage across the base-emitter junction of NPN transistor 19. Forward bias base current $I_{B1}$ will flow from the positive voltage supply $V_c$ through the series connected switch 27 and resistor 25 into the base electrode of transistor 19. This current $I_{B1}$ charges the interelectrode capacitance 57, shown in phantom, as indicated.

The transistor 19, as a result of the forward biasing applied at its base will become conductive or turn on, whereby a current will flow from the positive voltage supply $V_c$ through the series circuit comprising resistor 21 and the collector-emitter current path of transistor 19, to ground. The value of resistors 25 and 29, and supply 31, determine the degree of conduction of transistor 19, and in switching circuits are of such value to cause transistor 19 to saturate.

When it is desired again to drive transistor 19 to cutoff, switch 27 is opened. The value of resistance of resistor 29 and the voltage amplitude of negative voltage supply 31 now determine the rate of discharge of interelectrode capacitance 57, and the final level of backbiasing applied to the base electrode of transistor 19. At a given value of source 31 voltage, the rate of discharge increases as resistor 29 is decreased in value; at a given value of resistor 29, the rate of discharge increases as the source voltage is made more negative. Typically, source 31 may provide a voltage in the range 1.5 to 6 volts, and resistor 29 may provide a resistance in the range of 10 to 1000 ohms. The capacitance discharge path is through the series circuit including resistor 29 and negative voltage supply 31, to ground. The discharge current is designated as $I_{B2}$.

At the instant switch 27 is opened, the base of transistor 19 is at somewhat over +0.6 volts relative to the emitter electrode which is at ground. The capacitance 57 now starts to discharge through the discharge circuit 29, 31. During the discharge, the voltage across the capacitance changes from somewhat over +0.6 volts to the source 31 voltage, a negative value as −0.3 volts. The Darlington pair 35, 37 senses the natural decay of the voltage across the capacitance as it discharges. As soon as the point in the capacitance discharge curve is reached at which the base voltage passes zero and starts to go negative, the Darlington pair 35, 37, can be triggered. Adjustment of variable resistor 33 may be employed to control the precise negative voltage value at the base of transistor 19 at which the Darlington pair 35, 37 switches on. Resistor 33 is in series with the base-emitter paths of transistors 35, 37, and the smaller the value of this resistor, the closer to zero volts will be the negative value of the voltage at A, that will turn on transistors 35, 37.

When transistors 35, 37 turn on, current flows through the light emitting diode 47 of optical isolator 15. The flow of current through the light emitting diode 47 causes it to emit light. Photodiode 49 responds to this light, by decreasing in impedance, permitting current to flow from positive supply $V_p$ to the base of transistor 41. This causes transistor 51 to turn on, whereby the voltage at the collector electrode of transistor 51 drops from $+V_p$ towards ground, providing an output signal between output terminal 53 and ground. This output signal is indicative of the turn off of transistor 19.

It should be noted that the combination of solid-state switch 13 and optical isolator 15 is not a necessary requirement of this invention. The optical isolator 15 is useful in those applications requiring isolated grounds, wherein optical isolator 15 provides an output signal at terminal 53 referenced to a ground that is different from the ground reference of the other portions of the system. If isolated grounds are not required, solid-state switch 13 and optical isolator 15 may be replaced by a single solid-state switch providing an output signal referenced to the common ground of the system.

In the circuit shown, the point at which the base electrode starts to go negative relative to the emitter electrode is arbitrarily assumed to be the point at which the transistor 19 turns off. This is desirable for many testing and other applications. However, in some other applications it may instead be desired to indicate when the voltage across the base-emitter junction reaches a forward value lower than that which will support conduction through the transistor (a forward voltage somewhat less than $1V_{be}$). With minor modification, this can be done. For example, this can be done by employing switch 13 with an appropriate threshold setting or by sensing the voltage at a different point in the discharge circuit.

Other uses of the storage time tracker include, for example, driven inverters including a pair of transistors. One of the transistors is driven into saturation, when the other transistor is cutoff. A storage time tracker may be employed to sense the time that one of the inverter transistors turns off and to produce an output signal for immediately turning on the other transistor of the inverter. Operation in this way increases the inverter switching speed and reduces the power lost during the switching transition.

What is claimed is:

1. A circuit for indicating when a bipolar transistor switches from a conducting to a nonconducting state, said transistor having a base-emitter junction, emitter, and base electrodes, said junction exhibiting a capacitance, said circuit comprising:

means for forward biasing the base-emitter junction of the transistor, whereby said base-emitter capacitance becomes charged in a sense to forward bias the transistor, and for then removing the forward bias;

a discharge circuit including a source of reverse bias voltage and a variable resistor connected in series between said base and emitter electrodes for providing a discharge path for said capacitance; and means coupled to a point in said discharge circuit, for sensing the natural decay of the voltage across said capacitance as it discharges into said discharge circuit, and for producing an output signal in response to said voltage reaching a given level.

2. The circuit as set forth in Claim 1, wherein said forward biasing means includes:

a source of forward bias voltage;

a resistor having one end connected to the base electrode of said transistor; and means for selectively connecting and disconnecting the other end of said resistor to said source of forward bias voltage.

3. The circuit as set forth in Claim 1, wherein said means for sensing includes a solid-state switch having an input electrode connected to the base electrode of said transistor.

4. A circuit for indicating when a bipolar transistor, having a base-emitter junction, has switched from a conducting to a nonconducting state comprising, in combination:

means for forward biasing said junction, whereby the capacitance exhibited by said base-emitter junction charges, and for then removing said forward bias;

a discharge circuit, including a source of reverse bias voltage, connected across said base-emitter junction, whereby when said forward bias is removed, said capacitance discharges through said discharge circuit toward the voltage of said source; and means coupled to said discharge circuit for sensing the natural decay of voltage across said capacitance as it discharges into said discharge circuit and for producing an output pulse in response to the voltage across said base-emitter junction reducing to a given value.

5. A circuit as set forth in claim 4, wherein said means coupled to said discharge circuit comprises means connected across said junction for sensing when the voltage across said junction changes from the forward to the reverse direction.

6. The circuit as set forth in claim 5, wherein said transistor is of one conductivity type and is connected at its emitter electrode to a point of reference potential, and wherein said means coupled to said discharge circuit comprises a transistor of opposite conductivity type connected at its emitter electrode to said point of reference potential, and coupled at its base electrode to the base electrode of the first mentioned transistor.

7. A method for providing an output signal indicative of the turn off of a transistor from a conductive state, said transistor having a base-emitter junction which is initially forward biased, and an interelectrode capacitance inherently across said base-emitter junction, which becomes charged during the conductive state of said transistor, comprising the consecutive steps of:

removing the forward bias from across the base-emitter junction of said transistor;

applying a reverse bias across the base-emitter junction of said transistor for discharging said interelectrode capacitance of said transistor toward a given reverse bias level;

sensing the voltage across said base-emitter junction as it naturally decays during the discharge of said capacitance;

producing an output signal at one level during the time said base-emitter junction is forward biased; and at the instant said voltage across said base-emitter junction changes from the forward to the reverse direction causing said output signal level abruptly to change.

8. The circuit as set forth in claim 3, wherein said solid-state switch includes a pair of transistors connected in a Darlington configuration, said pair of transistors having commonly connected collector electrodes, a base electrode of one of said transistors serving as said input electrode, said one transistor also having an emitter electrode connected to a base electrode of the other transistor of said pair, said other transistor having an emitter electrode, said transistors being normally cut off, and being turned on when said voltage across said capacitance reduces to a given level.

* * * * *